(12) United States Patent
Nakanishi et al.

(10) Patent No.: US 9,287,867 B2
(45) Date of Patent: Mar. 15, 2016

(54) PULSE SYNTHESIZING CIRCUIT

(71) Applicant: Onkyo Corporation, Osaka (JP)

(72) Inventors: Yoshinori Nakanishi, Osaka (JP);
Tsuyoshi Kawaguchi, Osaka (JP);
Mamoru Sekiya, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 14/295,658

(22) Filed: Jun. 4, 2014

(65) Prior Publication Data
US 2014/0361809 A1 Dec. 11, 2014

(30) Foreign Application Priority Data
Jun. 11, 2013 (JP) .................................. 2013-123048

(51) Int. Cl.
*H03K 19/02* (2006.01)
*H03K 19/00* (2006.01)
*H03K 19/21* (2006.01)
*H03M 3/00* (2006.01)
(Continued)

(52) U.S. Cl.
CPC ...... *H03K 19/0002* (2013.01); *H03K 19/09443* (2013.01); *H03K 19/21* (2013.01); *H03M 3/30* (2013.01); *H04L 25/4923* (2013.01); *H04L 25/4925* (2013.01)

(58) Field of Classification Search
CPC .............. H03K 19/21; H03K 19/0002; H03K 19/09425
USPC ................................................ 326/52, 59, 60
See application file for complete search history.

(56) References Cited

U.S. PATENT DOCUMENTS 3,126,537 A * 3/1964 Trampel .......................... 341/57
3,217,316 A * 11/1965 Trampel .......................... 326/60
4,972,106 A    11/1990 Ruijs
(Continued)

FOREIGN PATENT DOCUMENTS

EP    0 334 443 A1    9/1989
JP    59-108430 A    6/1984
(Continued)

OTHER PUBLICATIONS

Takashima D et al: "Open/Folded Bit-Line Arrangement for Ultra-High-Density DRAM's", IEEE Journal of Solid-State Circuits, IEEE Service Center, Piscataway, NJ, USA, vol. 29, No. 4, Apr. 1, 1994, pp. 539-542,XP000450879, ISSN: 0018-9200, DOI: 10.1109/4.280706 figure 3(a).

(Continued)

*Primary Examiner* — Don Le
(74) *Attorney, Agent, or Firm* — Renner, Otto, Boisselle & Sklar, LLP (57) ABSTRACT

A circuit having versatility synthesizes one-bit digital signals to generate a ternary signal. The pulse synthesizing circuit synthesizes one-bit digital signals from two DFFs to generate a ternary signal. The pulse synthesizing circuit has a first NOR gate, a second NOR gate, a third NOR gate, and three switches. The first switch is connected to a first electric potential, the second switch is connected to a second electric potential, and the third switch is connected to a third electric potential. The first to third switches are turned on/off according to logical values of the signals from the two DFFs, and any of the first electric potential, the second electric potential, and the third electric potential is set as an output potential so that a ternary signal is generated.

6 Claims, 9 Drawing Sheets

(51) Int. Cl.
  *H03K 19/0944* (2006.01)
  *H04L 25/49* (2006.01)

(56) References Cited

U.S. PATENT DOCUMENTS

| 5,633,631 | A | 5/1997 | Teckmean | |
|---|---|---|---|---|
| 8,106,809 | B2 | 1/2012 | Groenewold | |
| 2004/0075466 | A1* | 4/2004 | Soral | 326/59 |
| 2006/0119389 | A1* | 6/2006 | Kaneda et al. | 326/60 |

FOREIGN PATENT DOCUMENTS

| JP | 62-272723 A | 11/1984 |
|---|---|---|
| JP | 61-193543 A | 8/1986 |
| JP | 64-054936 A | 3/1989 |
| JP | 10-233634 A | 9/1998 |
| JP | 2007-312258 A | 11/2007 |
| JP | 2012-527187 A | 11/2012 |

OTHER PUBLICATIONS

European Search Report for corresponding European Application No. EP 14 16 9999 mailed Aug. 14, 2014.

Dipartimento Di et al., "Universista' Degli Studi Di Pavia (Correction Techniques for Multi-Bit Sigma-Delta Converters)", Dec. 31, 2014, XP055235652.

* cited by examiner

PULSE SYNTHESIZING CIRCUIT

BACKGROUND OF THE INVENTION

1. Field of the Invention

The present invention relates to a pulse synthesizing circuit.

2. Description of the Related Art

Conventionally, delta sigma modulation (ΔΣ modulation) is used in switching amplifiers or the like. A delta sigma modulator has an integrator, a quantizer, and a quantization error feedback circuit.

Figure 9:
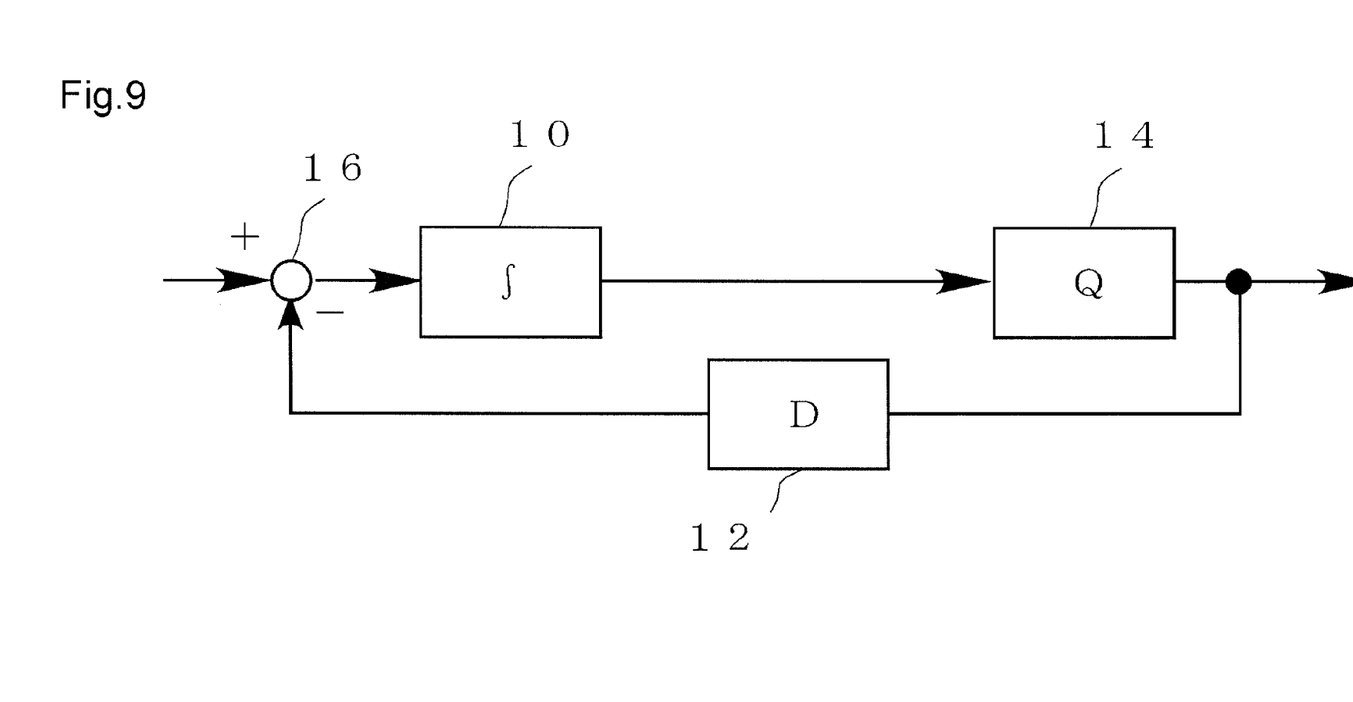
FIG. 9 is a configuration block diagram of a conventional technique.

FIG. 9 illustrates a basic configuration of a delta sigma modulation circuit. A subtracter 16 calculates a difference between an input signal and a feedback signal, and an integrator 10 integrates the difference signal. An integral signal is quantized by a quantizer 14 and is output as, for example, one-bit (=binary) signal. The quantization error is fed back via a delay device 12.

JP 2007-312258 A discloses a delta sigma modulation circuit including an integrator group, an adder group, a quantizer, and a pulse width round-up circuit, and further discloses that a signal is converted into a one-bit signal synchronized with a sampling clock so as to be output. In addition, JP 2007-312258 A discloses that a D-type flip-flop is used as the quantizer. JP 2012-527187 W also discloses a delta sigma modulation circuit. Further, JP H10-233634 A discloses a configuration in which a quantized output signal that is obtained from an input analog signal and is output from a delta signal modulation unit is made to be a ternary signal, and positive voltage application, application off, and negative voltage application are set as switching control signals according to the ternary signal so that the switching control signals are output.

When pulse synthesis is performed in order to output the quantized output signal subjected to the delta signal modulation as a ternary signal, JP H10-233634 A is based on a premise that an output from the quantizer is a multi-valued (ternary or more) signal, and thus has a problem that versatility is lacking.

SUMMARY OF THE INVENTION

It is an object of the present invention to provide a circuit that can synthesize and output pulse signals easily with a configuration having excellent versatility.

The present invention provides a pulse synthesizing circuit for synthesizing a first one-bit digital signal and a second one-bit digital signal to generate a ternary signal, the circuit including a logic circuit for outputting a first electric potential in a first case of a combination of a logical value of the first one-bit digital signal and a logical value of the second one-bit digital signal, outputting a second electric potential smaller than the first electric potential in a second case where a combination of a logical value of the first one-bit digital signal and a logical value of the second one-bit digital signal is different from the combination in the first case, and outputting a third electric potential between the first electric potential and the second electric potential in a third case where a combination of a logical value of the first one-bit digital signal and a logical value of the second one-bit digital signal is different from the combinations in the first case and the second case.

The present invention further provides a pulse synthesizing circuit, the logic circuit outputs the first electric potential when the logical value of the first one-bit digital signal is 1 and the logical value of the second one-bit digital signal is 0, outputs the second electric potential smaller than the first electric potential when the logical value of the first one-bit digital signal is 0 and the logical value of the second one-bit digital signal is 1, and outputs the third electric potential between the first electric potential and the second electric potential when the logical value of the first one-bit digital signal is 1 and the logical value of the second one-bit digital signal 1 or when the logical value of the first one-bit digital signal is 0 and the logical value of the second one-bit digital signal is 0.

In the present invention, when two one-bit digital signals are synthesized, a first electric potential is output in a logical value 1 of the first one-bit digital signal and a second electric potential is output in a logical value 1 of the second one-bit digital signal, and when both the logical values are 1 or when both the logical values are 0, a third electric potential that is between the first electric potential and the second electric potential is output. Accordingly, the two one-bit digital signals are synthesized so that a ternary signal having the three electric potentials, i.e., the first electric potential, the second electric potential, and the third electric potential, can be output. In the present invention, an output from the quantizer may be a one-bit digital signal, and the present invention is not based on the premise that the output is a multi-valued (ternary or more) signal.

In accordance with one embodiment of the present invention, the logic circuit includes a logical gate group and a switch group, the switch group includes a first switch connected to the first electric potential, a second switch connected to the second electric potential, and a third switch connected to the third electric potential, and the logical gate group outputs a control signal for turning on the first switch when the logical value of the first one-bit digital signal is 1 and the logical value of the second one-bit digital signal is 0, outputs a control signal for turning on the second switch when the logical value of the first one-bit digital signal is 0 and the logical value of the second one-bit digital signal is 1, and outputs a control signal for turning on the third switch when the logical value of the first one-bit digital signal is 1 and the logical value of the second one-bit digital signal is 1 or when the logical value of the first one-bit digital signal is 0 and the logical value of the second one-bit digital signal is 0.

In accordance with another embodiment of the present invention, the first switch is a first three-state buffer whose input terminal is connected to the first electric potential, the second switch is a second three-state buffer whose input terminal is connected to the second electric potential, the third switch is an analog switch whose input terminal is connected to the third electric potential, output terminals of the first, second, and third switches are connected, and the logical gate group includes a first NOR gate for receiving an inverted signal of the first one-bit digital signal and the second one-bit digital signal, and performing a logical operation so as to output a signal to a control terminal of the first switch, a second NOR gate for receiving the first one-bit digital signal and an inverted signal of the second one-bit digital signal, and performing a logical operation so as to output a signal to a control terminal of the second switch, and a third NOR gate for receiving a control signal from the first NOR gate and a control signal from the second NOR gate, and performing a logical operation so as to output the control signals to the third switch.

Further, the present invention provides a pulse synthesizing circuit, the logic circuit outputs the first electric potential when the logical value of the first one-bit digital signal is 1 and the logical value of the second one-bit digital signal is 1, outputs the second electric potential smaller than the first electric potential when the logical value of the first one-bit digital signal is 0 and the logical value of the second one-bit digital signal is 0, and outputs the third electric potential between the first electric potential and the second electric potential when the logical value of the first one-bit digital signal is 1 and the logical value of the second one-bit digital signal is 0 or when the logical value of the first one-bit digital signal is 0 and the logical value of the second one-bit digital signal is 1.

In accordance with one embodiment of the present invention, the logic circuit includes a logical gate group and a switch group, the switch group includes a first switch connected to the first electric potential, a second switch connected to the second electric potential, and a third switch connected to the third electric potential, and the logical gate group outputs a control signal for turning on the first switch when the logical value of the first one-bit digital signal is 1 and the logical value of the second one-bit digital signal is 1, outputs a control signal for turning on the second switch when the logical value of the first one-bit digital signal is 0 and the logical value of the second one-bit digital signal is 0, and outputs a control signal for turning on the third switch when the logical value of the first one-bit digital signal is 1 and the logical value of the second one-bit digital signal is 0 or when the logical value of the first one-bit digital signal is 0 and the logical value of the second one-bit digital signal is 1.

In accordance with another embodiment of the present invention, the first switch is a P channel MOSFET, the second switch is a N channel MOSFETs, the third switch is an analog switch, and the logical gate group includes a NAND gate for receiving the first one-bit digital signal and the second one-bit digital signal, and performing a logical operation so as to output a control signal to a gate of the first switch, a NOR gate for receiving the first one-bit digital signal and the second one-bit digital signal, and performing a logical operation so as to output a control signal to a gate of the second switch, and an EXOR gate for receiving the control signal from the NAND gate and the control signal from the NOR gate, and performing a logical operation so as to output a control signal to the third switch.

Further, the present invention provides the pulse synthesizing circuit, the logic circuit outputs the first electric potential when the logical value of the first one-bit digital signal is 0 and the logical value of the second one-bit digital signal is 0, outputs the second electric potential smaller than the first electric potential when the logical value of the first one-bit digital signal is 1 and the logical value of the second one-bit digital signal is 1, and outputs the third electric potential between the first electric potential and the second electric potential when the logical value of the first one-bit digital signal is 1 and the logical value of the second one-bit digital signal is 0 or when the logical value of the first one-bit digital signal is 0 and the logical value of the second one-bit digital signal is 1.

In accordance with one embodiment of the present invention, the logic circuit includes a logical gate group and a switch group, the switch group includes a first switch connected to the first electric potential, a second switch connected to the second electric potential, and a third switch connected to the third electric potential, and the logical gate group outputs a control signal for turning on the first switch when the logical value of the first one-bit digital signal is 0 and the logical value of the second one-bit digital signal 0, outputs a control signal for turning on the second switch when the logical value of the first one-bit digital signal is 1 and the logical value of the second one-bit digital signal 1, and outputs a control signal for turning on the third switch when the logical value of the first one-bit digital signal is 1 and the logical value of the second one-bit digital signal is 0 or when the logical value of the first one-bit digital signal is 0 and the logical value of the second one-bit digital signal is 1.

In accordance with another embodiment of the present invention, the first switch is a first three-state buffer whose input terminal is connected to the first electric potential, the second switch is a second three-state buffer whose input terminal is the second electric potential, the third switch is an analog switch whose input terminal is connected to the third electric potential, output terminals of the first, second, and third switches are connected, and the logical gate group includes a NOR gate for receiving the first one-bit digital signal and the second one-bit digital signal, and performing a logical operation so as to output a signal to a control terminal of the first switch, a NAND gate for receiving the first one-bit digital signal and the second one-bit digital signal, and performing a logical operation so as to output a signal to a control terminal of the second switch, and an EXOR gate for receiving the control signal from the NOR gate and the control signal from the NAND gate, and performing a logical operation so as to output a control signal to the third switch.

In the present invention, the first one-bit digital signal and the second one-bit digital signal can be signals subjected to delta sigma modulation.

According to the present invention, pulse signals can be synthesized and output easily with a simple configuration having satisfactory versatility.

DETAILED DESCRIPTION OF THE PREFERRED EMBODIMENTS

Embodiments of the present invention will be described below with reference to the drawings.

A signal modulation circuit according to this embodiment performs delta sigma modulation on an input signal, and includes a subtracter, a delay device, and a quantizer. In the circuit according to this embodiment, the delay device is not present on a feedback route, and the delay device is provided at a front stage of the quantizer, that is, between the integrator and the quantizer. Therefore, in the circuit according to this embodiment, an output state can be corrected in real time.

The delay device according to this embodiment has a function for not only delaying an input signal but also inserting a zero level into an input signal, and this realizes more reliable pulse density modulation (PDM). Any circuit for inserting the zero level into an input signal is used, but it can be configured by, for example, a chopper circuit whose one end is grounded. Further, the delay function and the quantizing function can be configured by a D-type flip-flop.

Figure 1:
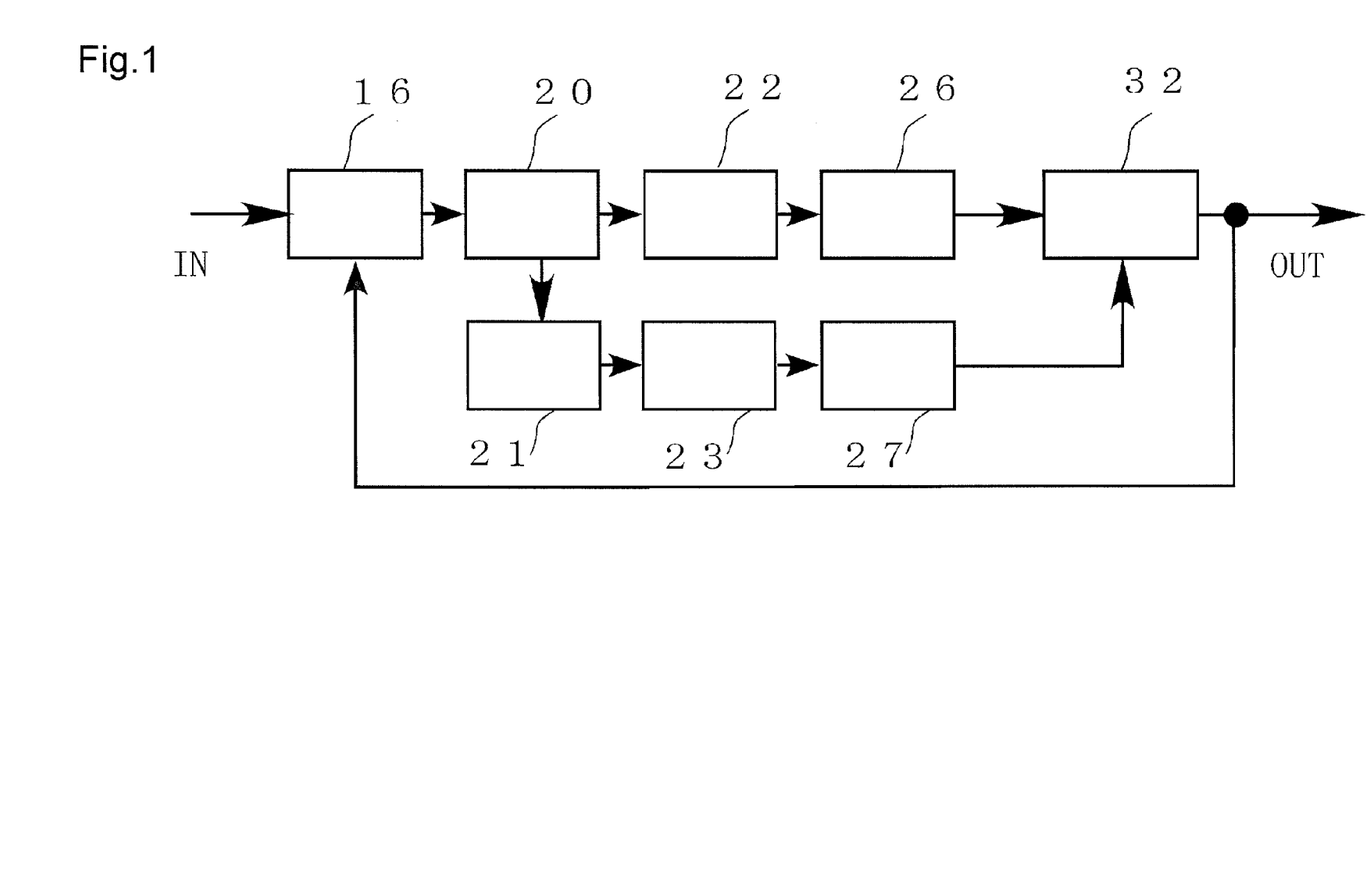
FIG. 1 is a configuration block diagram according to an embodiment.

FIG. 1 is a circuit configuration diagram according to this embodiment. The signal modulation circuit according to this embodiment includes a subtracter 16, an integrator 20, a phase inverting circuit 21, chopper circuits 22 and 23, D-type flip-flops (DFF) 26 and 27, and a pulse synthesizing circuit 32.

The subtracter 16 calculates a difference between an input signal and a signal fed back from the pulse synthesizing circuit 32 (negative feedback) and outputs the calculated difference to the integrator 20.

The integrator 20 integrates the difference signal so as to output the integrated signal to the chopper circuit 22. Further, the integrator 20 integrates the difference signal so as to output it to the phase inverting circuit 21, and the phase inverting circuit 21 inverts a phase of the integral signal so as to output the signal to the chopper circuit 23.

The chopper circuits 22 and 23 insert a zero level (zero voltage) into the integral signal and the inverted signal in synchronization with a clock signal so as to output the signals to the DFFs 26 and 27, respectively.

The DFFs 26 and 27 delay and quantize input signals in synchronization with the clock signal, respectively, and generate and output one-bit digital signals, respectively.

The pulse synthesizing circuit 32 synthesizes the one-bit digital signal from the DFF 26 with the one-bit digital signal from the DFF 27 so as to output the synthesized signal. Since the DFF 26 converts the integral signal into a one-bit digital signal so as to output the converted signal, this signal is a binary signal of +1 and 0. On the other hand, since the DFF 27 converts the inverted signal obtained by inverting the integral signal through the phase inverting circuit 21 into a one-bit digital signal so as to output the signal, this signal is a binary signal of −1 and 0. The pulse synthesizing circuit 32 synthesizes these two binary signals, and generates a ternary signal of +1, 0, and −1 so as to output the generated signal. The output signal from the pulse synthesizing circuit 32 is negatively fed back to the subtracter 16 in the above manner.

Figure 2:
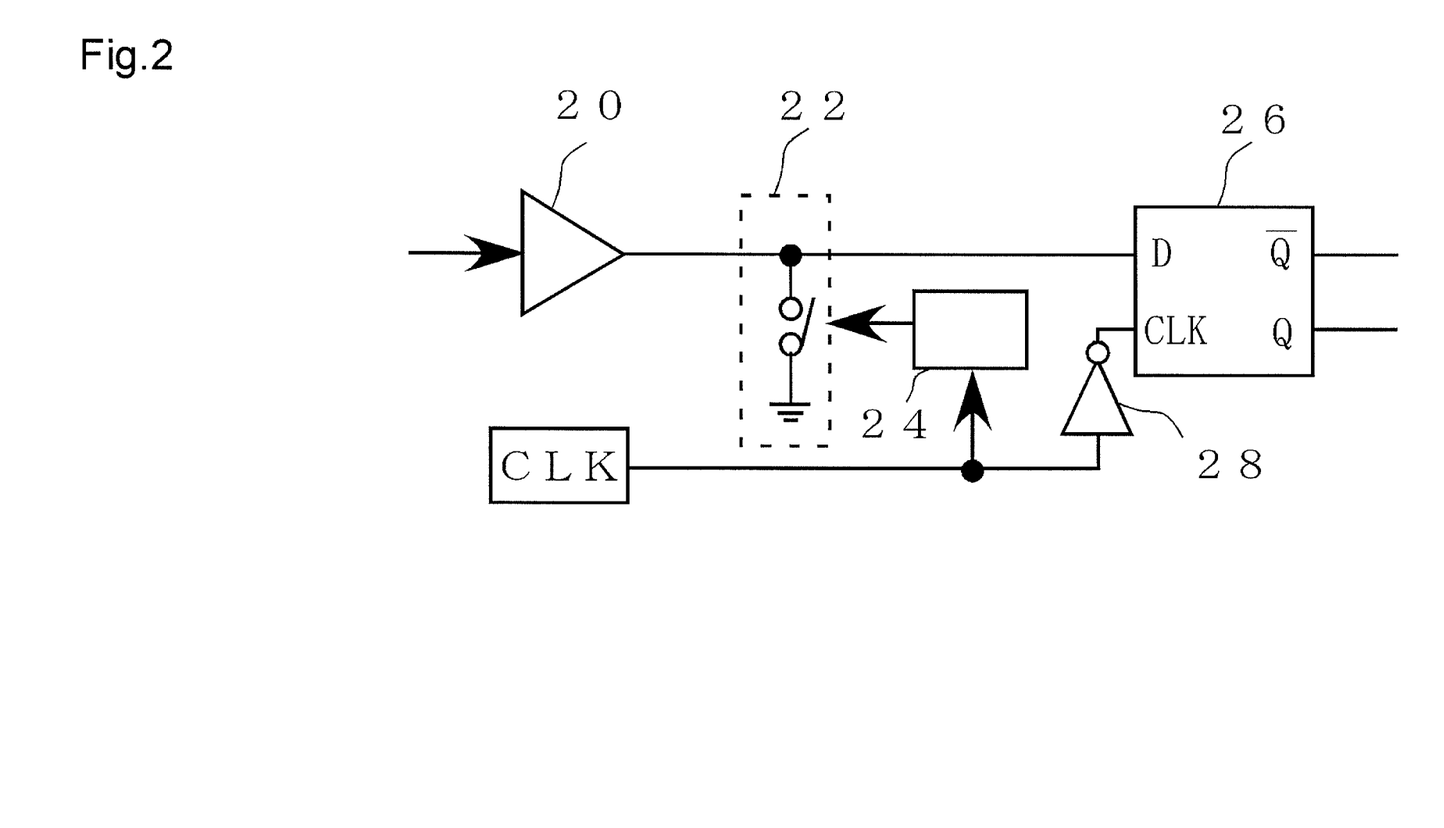
FIG. 2 is a circuit configuration diagram according to the embodiment.

FIG. 2 illustrates a specific circuit configuration of the integrator 20, the chopper circuit 22, and the DFF 26 in FIG. 1. The chopper circuit 23 and the DFF 27 basically have the same configurations as those of the chopper circuit 22 and the DFF 26.

The chopper circuit 22 is configured by a switch whose one end is connected to an output end of the amplifier 20 serving as the integrator and whose other end is grounded. Switching of the switch is controlled by an output signal from a ½ frequency divider 24. The output signal from the chopper circuit 22 is supplied to a D terminal of the DFF 26.

The ½ frequency divider 24 is a circuit for receiving a clock signal and dividing a frequency of the clock signal to ½. The ½ frequency divider 24 divides the frequency of the clock signal and controls the switch of the chopper circuit 22. Therefore, the switch of the chopper circuit 22 is turned on/off in a cycle that is twice as long as the clock signal. At the timing when the switch is turned on, the output end of the amplifier 20 is in a zero level because it is grounded via the switch. Therefore, the chopper circuit 22 functions as a circuit for inserting the zero level into the input signal of the DFF 26.

A signal, which is the output signal from the amplifier 20 and into which the zero level is inserted in synchronization with the clock signal through the chopper circuit 22 as described above, is supplied to the D terminal of the DFF 26. Further, a clock signal that is inverted by an inverter 28 is supplied to a clock terminal of the DFF 26. The DFF 28 outputs a signal at a rising edge of the input clock signal. Therefore, in this embodiment, the signal is output at a rising edge of the inverted clock signal.

Figure 3:
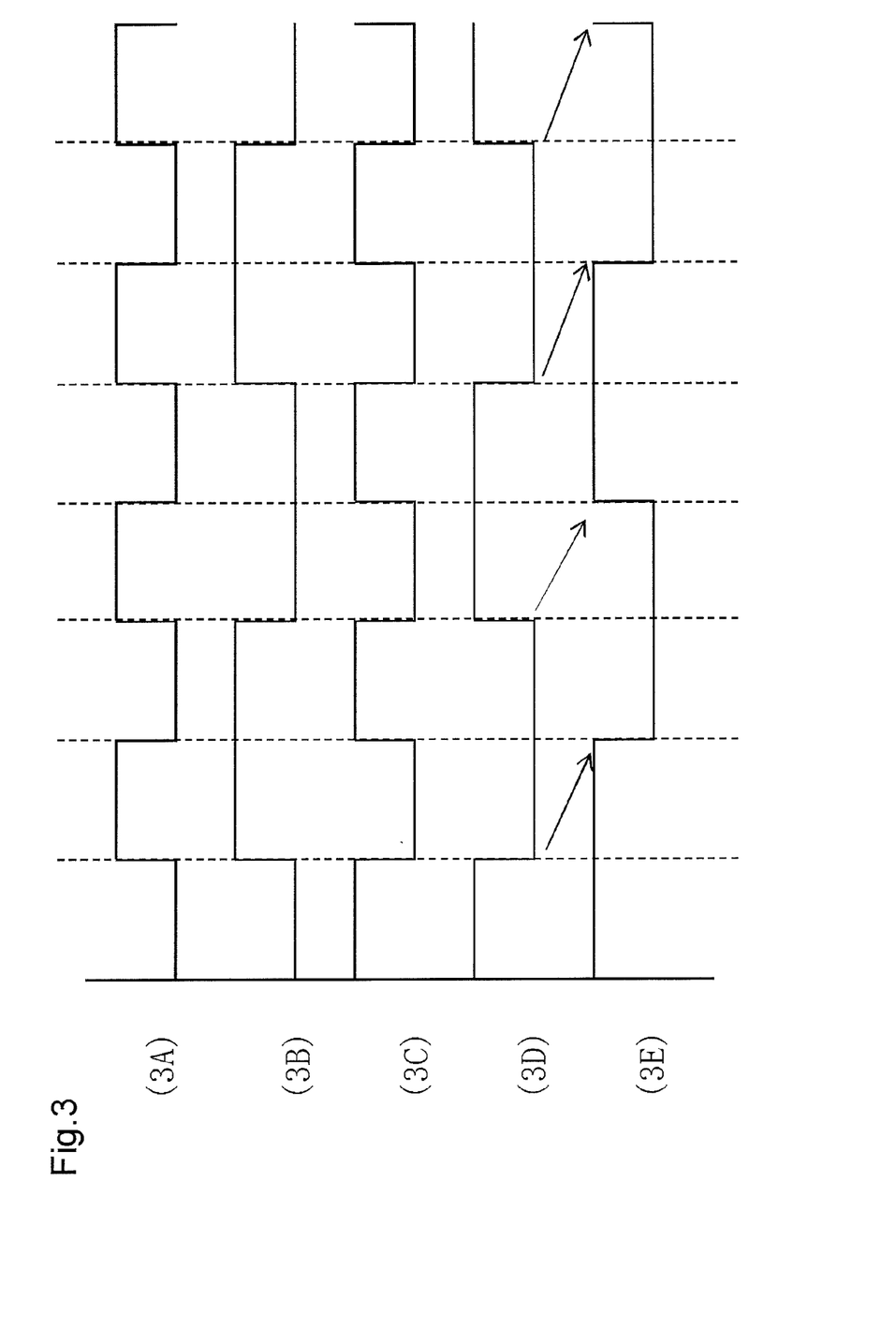
FIG. 3 is a timing chart according to the embodiment.

FIG. 3 is a timing chart of the circuit in FIG. 2. This is the timing chart for a case where a positive signal is input. FIG. 3 illustrates, from the top, waveforms of a clock signal (CLK), a ½ frequency divided signal of the clock signal, an inverted signal of the clock signal, a signal to be supplied to the D terminal of the DFF 26, and a signal to be output from a Q output terminal of the DFF 26.

Since the chopper circuit 22 is switched on at the timing of the ½ frequency divided signal of the clock signal, a signal to be supplied to the D terminal of the DFF 26 is synchronized with the ½ frequency divided signal of the clock signal so as to be at the zero level. This signal is synchronized with the inverted signal of the clock signal and is delayed to the timing of the rising edge of the inverted signal of the clock signal so as to be output. In the above manner, the circuit in FIG. 2 performs integration, insertion of the zero level, delay, and quantization on an input signal. That is, the chopper circuit 22 and the DFF 26 realize the zero level, the delay, and the quantization so that noise shape is realized without inserting the delay device into the feedback route. Further, the chopper circuit 22 always outputs the zero level once at the timing of the clock signal.

The pulse synthesizing circuit 32 in FIG. 1 will be described below.

As described above, the pulse synthesizing circuit 32 synthesizes the two binary signals from the DFFs 26 and 27 to generate and output a ternary signal of +1, 0, and −1. When a one-bit digital signal is output, an order of the integration needs to be increased in order to secure SNR, and an oscillation frequency needs to be set higher. For this reason, there is a concern that the one-bit digital signal causes an increase in cost, but the generation and the output of the ternary signal of +1, 0, and −1 can improve SNR without increasing the cost. However, the above configuration in JP H10-233634 A is based on the premise that the output from the quantizer is a multi-valued (ternary or more) signal, and thus it cannot be applied to the outputs from the DFFs 26 and 27 according to this embodiment, and lacks versatility. Further, generally, a configuration is publicly known in which two switches whose outputs are short-circuited with a first electric potential and a second electric potential are provided when pulse signals are synthesized are provided, and these switches are alternately turned on/off so as to synthesize signals. However, a problem may occur in which both the two switches are turned on and the first electric potential and the second electric potential are short-circuited. Further, in order to prevent the problem of the short circuit, use of a dead time adjusting circuit is proposed. The dead time adjusting circuit adjusts the timing so that a period for which both the switches are turned off at the switching timing of the two switches. However, this causes another problem of distortion at the switch stage due to the period.

In view of such a problem, the pulse synthesizing circuit 32 according to this embodiment solves the problem of the short circuit between the two switches to be turned on/off alternately, removes signal distortion, and synthesizes two pulse signals so as to generate a ternary signal of +1, 0, and −1.

Figure 4:
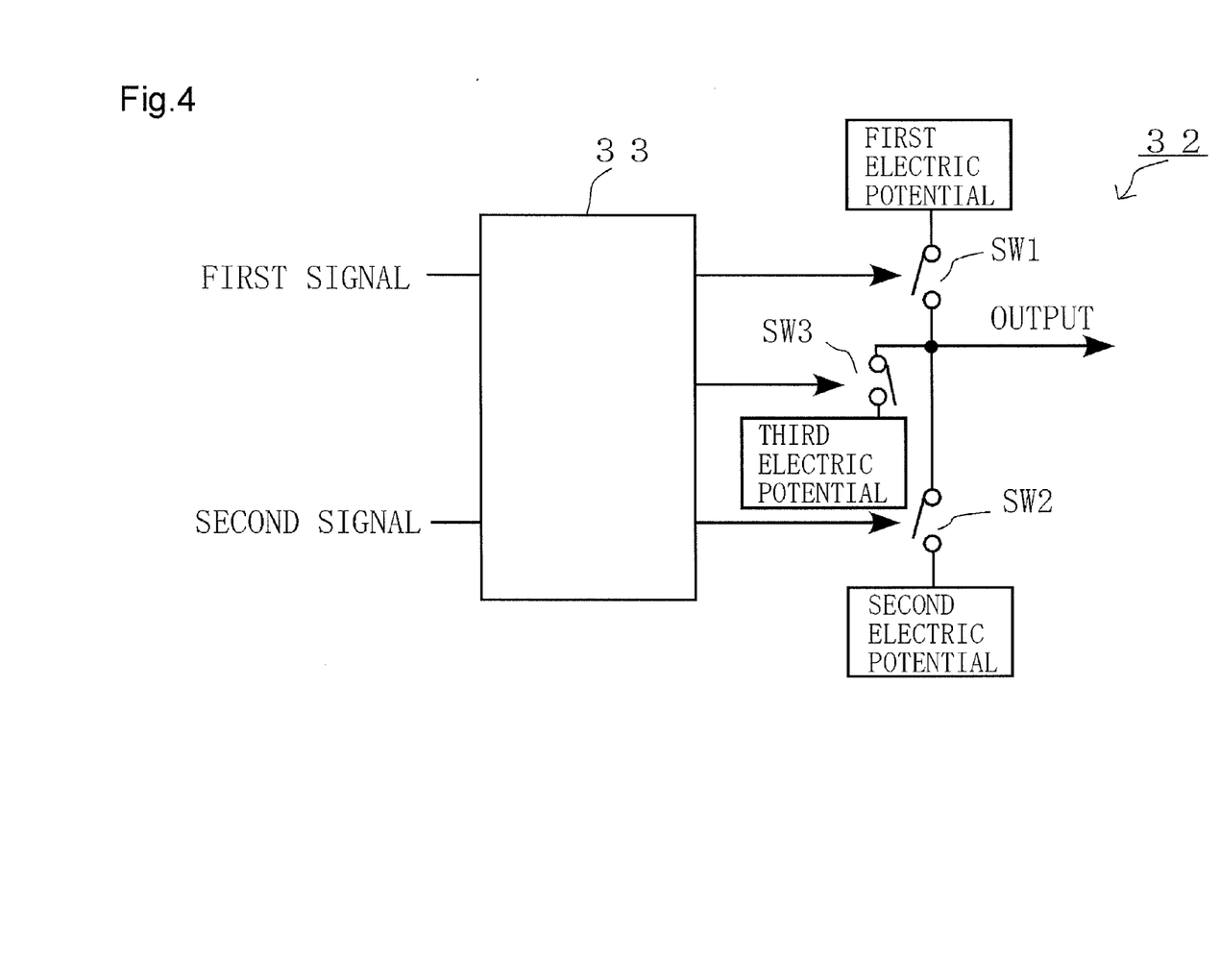
FIG. 4 is a basic configuration diagram of a pulse synthesizing circuit according to the embodiment.

FIG. 4 is a basic configuration diagram illustrating the pulse synthesizing circuit 32. The pulse synthesizing circuit 32 includes a driving circuit 33 and three switches SW1 to SW3.

The switches SW1 and SW2 are connected to each other in series, and one terminal of the switch SW1 is set at the first electric potential, and the other terminal of the switch SW1 is connected to one terminal of the switch SW2. Further, the other terminal of the switch SW2 is connected to the second electric potential. Further, a connection node between the switches SW1 and SW2 is connected to one terminal of the switch SW3, and the other terminal of the switch SW3 is connected to a third electric potential. An output signal of the pulse synthesizing circuit 32 is output from the connection node between the switches SW1 and SW2. In this case, the first electric potential>the third electric potential>the second electric potential is satisfied.

The driving circuit 33 outputs control signals to the switches $S_{W1}$ to SW3 based on a first signal and a second signal that are two one-bit digital signals, respectively, so as to control the switches SW1 to SW3 into the on/off state as follows.

<When the first signal has a logical value 1 (Hi) and the second signal has a logical value 0 (Low)>

SW1: on
SW2: off
SW3: off

In this case, an output potential is set to the first electric potential.

<When the first signal has the logical value 0 (Low) and the second signal has the logical value 1 (Hi)>

SW1: off
SW2: on
SW3: off

In this case, the output potential is set to the second electric potential.

<When the first signal has the logical value 0 (Low) and the second signal has the logical value 0 (Low)>

SW1: off
SW2: off
SW3: on

In this case, the output potential is set to the third electric potential.

<When the first signal has the logical value 1 (Hi) and the second signal has the logical value 1 (Hi)>

SW1: off
SW2: off
SW3: on

In this case, the output potential is set to the third electric potential.

As described above, the first signal and the second signal which are the two one-bit digital signals are synthesized, and a ternary signal having any of the three electric potentials, i.e., the first electric potential, the second electric potential, and the third electric potential, is output according to the logical value of the first signal and the logical value of the second signal. Note that, in the above four cases, a state where both the switches SW1 and SW2 are turned on and the first electric potential and the second electric potential are short circuited is not caused by any combinations of the logical values of the first signal and the second signal.

Since the pulse synthesizing circuit 32 according to this embodiment can prevent both the switches SW1 and SW2 from being turned on and being short-circuited by error without providing a dead time, signal distortion does not occur.

The basic operation principle of the pulse synthesizing circuit 32 has been described above. Hereinafter, the pulse synthesizing circuit 32 will be described in detail.

Figure 5:
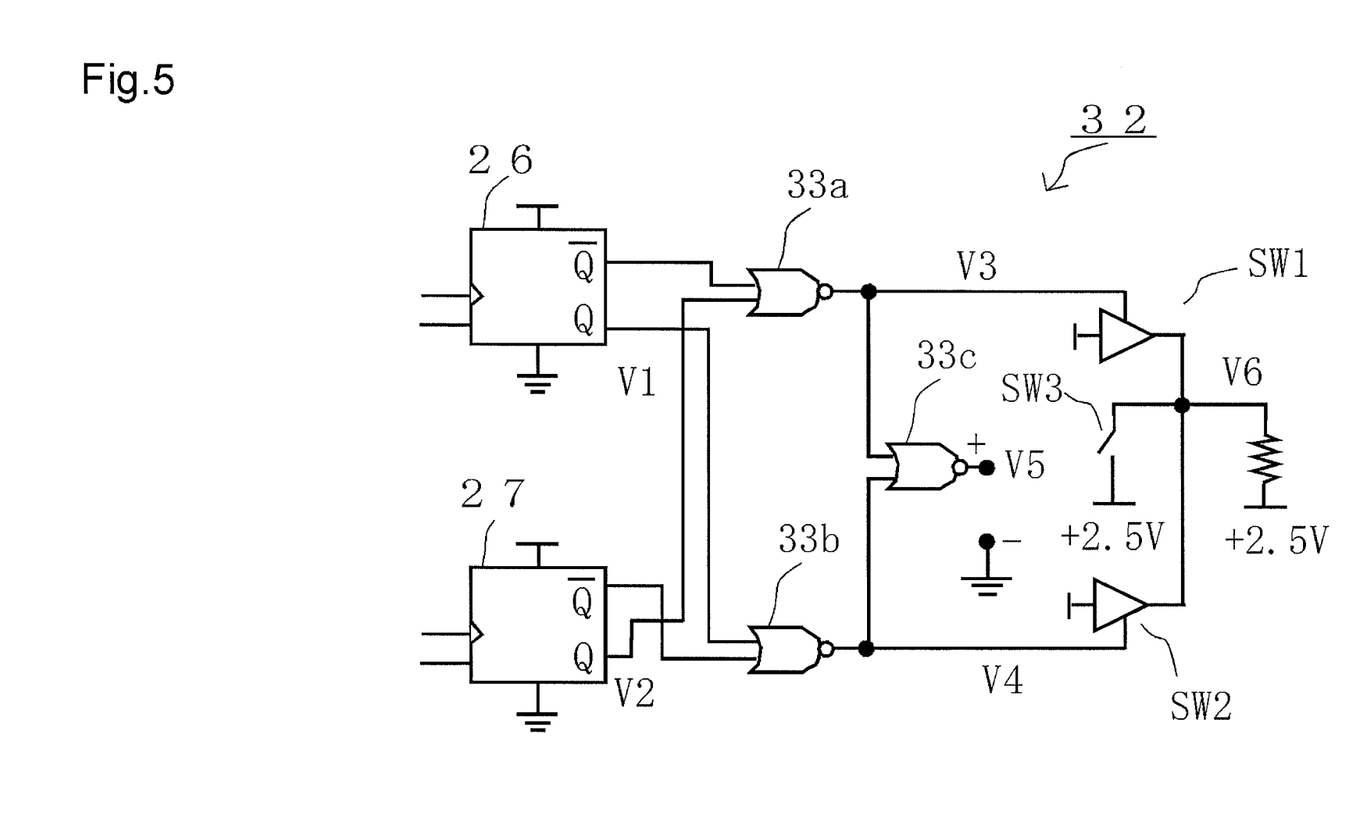
FIG. 5 is a circuit configuration diagram illustrating the pulse synthesizing circuit according to the embodiment.

FIG. 5 illustrates a circuit configuration of the pulse synthesizing circuit 32. The pulse synthesizing circuit 32 synthesizes the two binary signals from the DFFs 26 and 27, and generates a ternary signal of +1, 0, and −1 so as to output the signal. The pulse synthesizing circuit 32 configured by a logical gate and the three switches SW1 to SW3. The logical gate includes three NOR gates 33a, 33b, and 33c. The switch SW1 is configured by a three-state buffer whose input terminal is connected to the first electric potential, and the switch SW2 is configured by a three-state buffer whose input terminal is connected to the second electric potential. The switch SW3 is configured by an analog switch whose input terminal is connected to the third electric potential. In this case, the first electric potential>the third electric potential>the second electric potential is satisfied.

One input terminal of the NOR gate (first NOR gate) 33a receives an output signal from an inverting output terminal (Q bar) of the DFF 26. Further, the other input terminal of the NOR gate 33a receives an output signal V2 from the output terminal (Q) of the DFF 27. The NOR gate 33a performs a NOR operation on both the signals so as to generate a signal V3. The signal V3 is supplied to the switch SW1, and is also supplied to one input terminal of the NOR gate 33c.

One input terminal of the NOR gate (second NOR gate) 33b receives an output signal V1 from the output terminal (Q) of the DFF 26. Further, the other input terminal of the NOR gate 33b receives an output signal from the inverting output terminal (Q bar) of the DFF 27. The NOR gate 33b performs the NOR operation on both the signals so as to generate a signal V4. The signal V4 is supplied to the switch SW2, and is also supplied to the other input terminal of the NOR gate 33c.

One input terminal of the NOR gate (third NOR gate) 33c receives the signal V3 from the NOR gate 33a. Further, the other input terminal of the NOR gate 33c receives the signal V4 from the NOR gate 33b. The NOR gate 33c performs the NOR operation on the signal V3 and the signal V4 so as to generate a signal V5. The signal V5 is supplied to the switch SW3.

In such a configuration, the signals V3 to V5 which are the output signals from the logical gates 33a, 33b, and 33c serve as control signals of the switches SW1 to SW3, and the states of the switches SW1 to SW3 change as follows.

When a signal of the inverting output terminal of the DFF 26 is "1" (the logical value), and a signal of the output terminal of the DFF 27 is "0", the output signal V3 from the NOR gate 33a is set to "0", and the switch SW1 is turned off. Further, the output signal V4 from the NOR gate 33b is set to "0", and the switch SW2 is turned off. Further, the output signal V5 from the NOR gate 33c is set to "1", and the switch SW3 is turned on. Accordingly, the switch SW1 is turned off, the switch SW2 is turned off, and the switch SW3 is turned on, and thus the output potential is set to the third electric potential by turning on the switch SW3.

When the signal of the inverting output terminal of the DFF 26 is "1" and the signal of the output terminal of the DFF 27 is "1", the output signal V3 from the NOR gate 33a is set to "0", and the switch SW1 is turned off. Further, the output signal V4 from the NOR gate 33b is set to "1", and the switch SW2 is turned on. Further, the output signal V5 from the NOR gate 33c is set to "0", and the switch SW3 is turned off. Accordingly, the switch SW1 is turned off, the switch SW2 is turned on, and the switch SW3 is turned off, and thus the output potential is set to the second electric potential by turning on the switch SW2.

When the signal of the inverting output terminal of the DFF 26 is "0" and the signal of the output terminal of the DFF 27 is "0", the output signal V3 from the NOR gate 33a is set to "1", and the switch SW1 is turned on. Further, the output signal V4 from the NOR gate 33b is set to "0", and the switch SW2 is turned off. Further, the output signal V5 from the NOR gate 33c is set to "0", and the switch SW3 is turned off. Accordingly, the switch SW1 is turned on, the switch SW2 is turned off, and the switch SW3 is turned off, and thus the output potential is set to the first electric potential by turning on the switch SW1.

When the signal of the inverting output terminal of the DFF 26 is "0" and the signal of the output terminal of the DFF 27 is "1", the output signal V3 from the NOR gate 33a is set to "0", and the switch SW1 is turned off. Further, the output signal V4 from the NOR gate 33b is set to "0", and the switch SW2 is turned off. Further, the output signal V5 from the NOR gate 33c is set to "1", and the switch SW3 is turned on. Accordingly, the switch SW1 is turned off, the switch SW2 is turned off, and the switch SW3 is turned on, and thus the output potential is set to the third electric potential by turning on the switch SW3.

Figure 6:
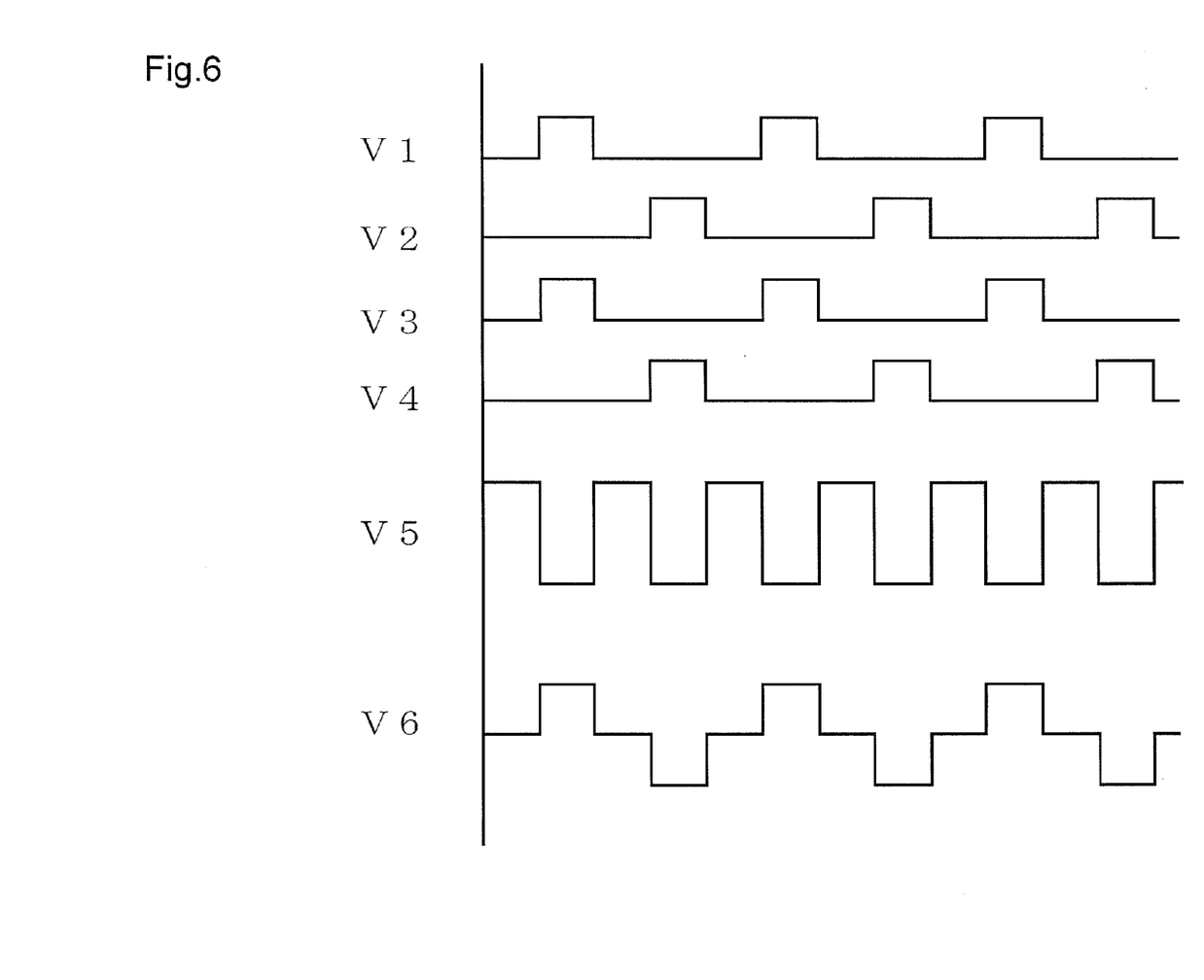
FIG. 6 is a timing chart according to the embodiment.

FIG. 6 is a timing chart of respective sections in the configuration of FIG. 5. FIG. 6 is the timing chart of signals V1 to V6, the signal V1 is a signal of the output terminal (Q) of the DFF 26, the signal V2 is a signal of the output terminal (Q) of the DFF 27, the signal V3 is an output signal from the NOR gate 33a, the signal V4 is an output signal from the NOR gate 33b, the signal V5 is an output signal from the NOR gate 33c, and the signal V6 is an output signal from the pulse synthesizing circuit 32.

When the signal V1 is "0" and the signal V2 is "0", one input terminal of the NOR gate 33a receives an inverted output (Q bar) of the signal V1 so as to be "1", and the other input terminal of the first NOR gate 33a receives the signal V2 so as to be "0". The output from the first NOR gate 33a is set to "0". Further, since one input terminal of the second NOR gate 33b receives the signal V1 so as to be "0", and the other input terminal of the second NOR gate 33b receives an inverted output (Q bar) of the signal V2 so as to be "1". The output from the second NOR gate 33b is set to "0". As a result, both the input terminals of the third NOR gate 33c receive "0", so that the output from the third NOR gate 33c is set to "1". As a result, since the signal V3 is "0", the signal V4 is "0", and the signal V5 is "1",
SW1: off
SW2: off
SW3: on
and the output signal V6 from the circuit is set to the third electric potential.

When the signal V1 is "1" and the signal V2 is "0", one input terminal of the first NOR gate 33a receives the inverted output (Q bar) of the signal V1 so as to be "0", and the other input terminal of the first NOR gate 33a receives the signal V2 so as to be "0". The output from the first NOR gate 33a is set to "1". Further, one input terminal of the second NOR gate 33b receives the signal V1 so as to be "1", and the other input terminal of the second NOR gate 33b receives the inverted output (Q bar) of the signal V2 so as to be "1". The output from the second NOR gate 33b is set to "0". As a result, the input terminal of the third NOR gate 33c receives "1" and "0", and the output from the third NOR gate 33c is set to "0". As a result, since the signal V3 is "1", the signal V4 is "0", and the signal V5 is "0",
SW1: on
SW2: off
SW3: off
and the output signal V6 of the circuit is set to the first electric potential.

When the signal V1 is "0" and the signal V2 is "1", one input terminal of the first NOR gate 33a receives the inverted output (Q bar) of the signal V1 so as to be "1", and the other input terminal of the first NOR gate 33a receives the signal V2 so as to be "1". The output from the first NOR gate 33a is set to "0". Further, one input terminal of the second NOR gate 33b receives the signal V1 so as to be "0", and the other input terminal of the second NOR gate 33b receives the inverted output (Q bar) of the signal V2 so as to be "0". The output from the second NOR gate 33b is set to "1". As a result, the input terminal of the third NOR gate 33c receives "0" and "1", and the output from the third NOR gate 33c is set to "0". As a result, since the signal V3 is "0", the signal V4 is "1", and the signal V5 is "0",
SW1: off
SW2: on
SW3: off
and the output signal V6 is set to the second electric potential. The first electric potential corresponds to +1, the second electric potential corresponds to −1, and the third electric potential corresponds to 0. In the above manner, the pulse synthesizing circuit 32 synthesizes two pulses from the DFFs 26 and 27 so as to generate a ternary signal of +1, 0, and −1.

In this embodiment, a one-bit digital signal from the DFF 26 and a one-bit digital signal from the DFF 27 are synthesized, so that the ternary signal of +1, 0, and −1 can be generated. Since the pulse synthesizing circuit 32 according to this embodiment is not based on the premise that the input signal is a multi-valued (ternary or more) signal, this circuit has excellent versatility and can realize low cost.

The embodiment of the present invention has been described above, but the present invention is not limited thereto, and various modifications can be made.

For example, the configuration of the pulse synthesizing circuit 32 is not limited to the circuit configuration shown in FIG. 5, and thus other circuit configurations can be adopted.

Figure 7:
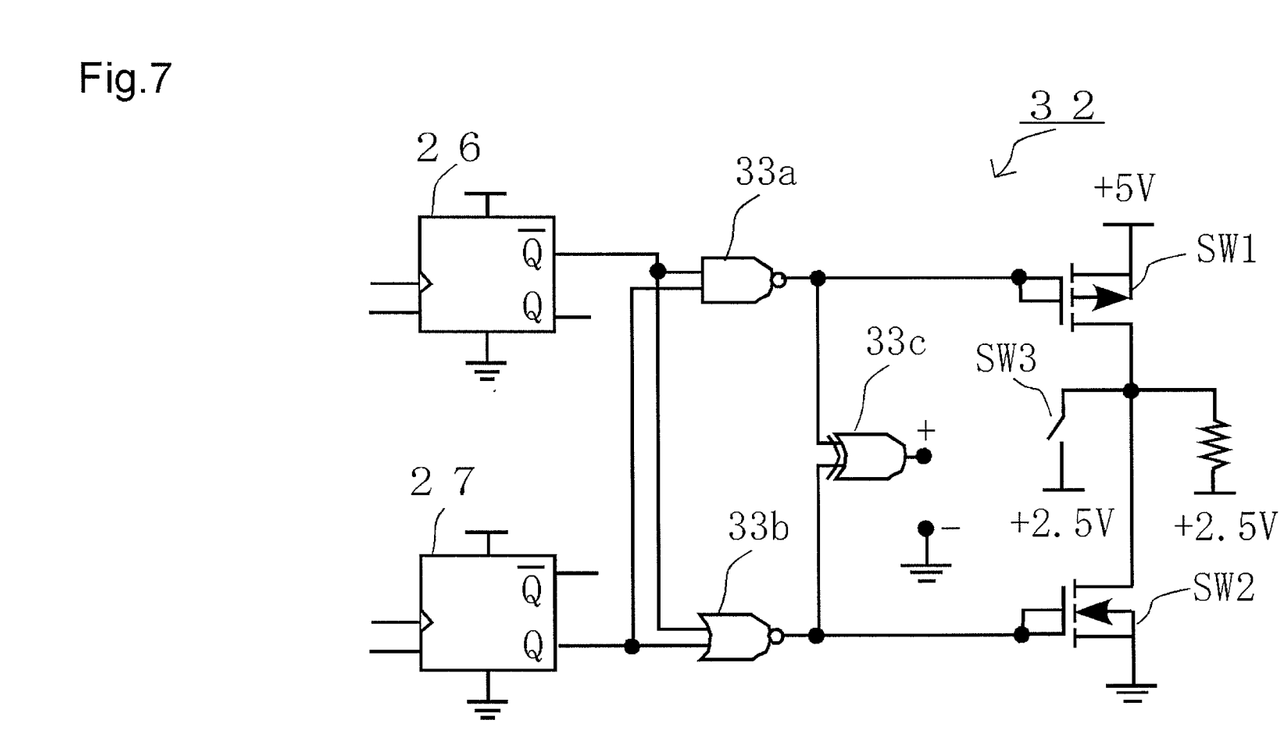
FIG. 7 is a circuit configuration diagram illustrating the pulse synthesizing circuit according to another embodiment.
Figure 8:
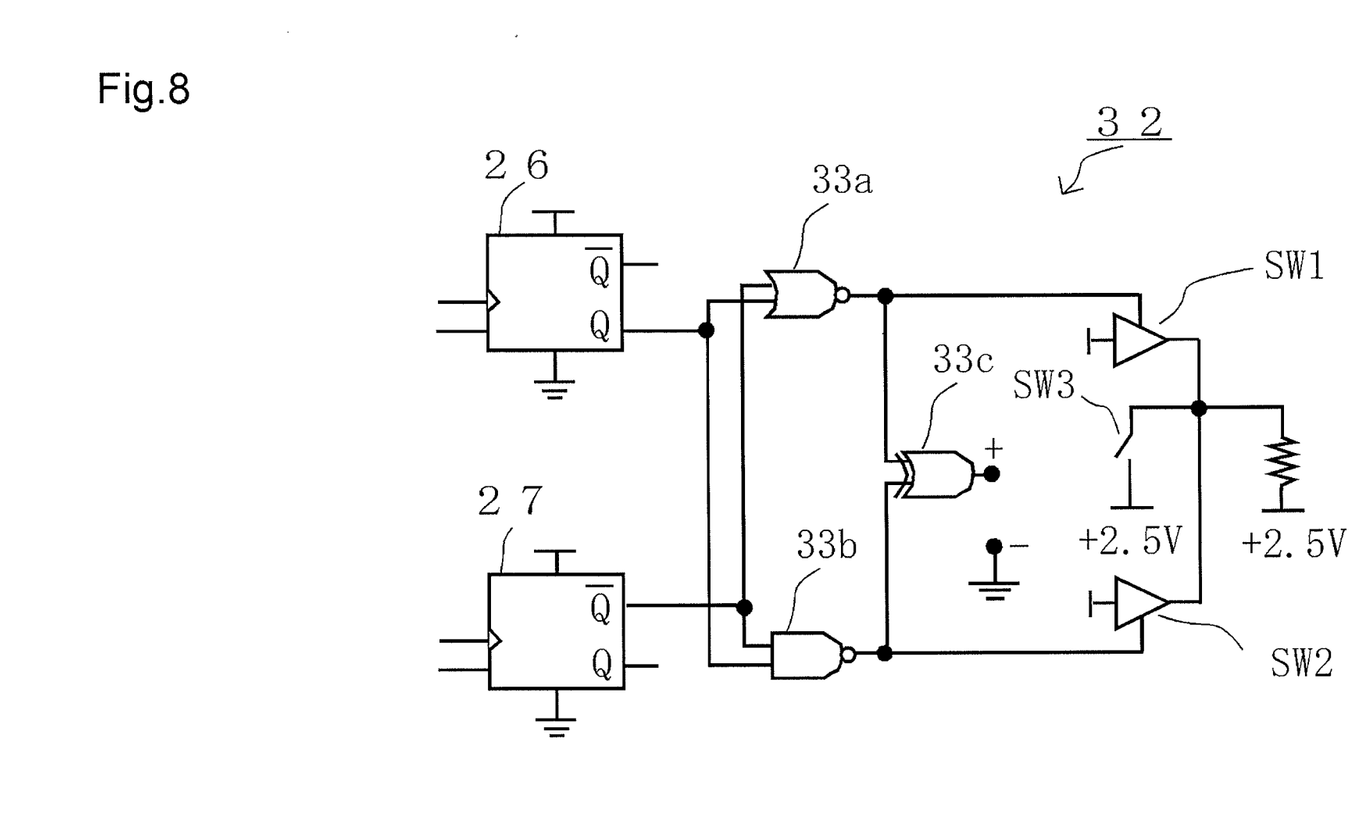
FIG. 8 is a circuit configuration diagram illustrating the pulse synthesizing circuit according to still another embodiment.

FIGS. 7 and 8 illustrate other circuit configurations of the pulse synthesizing circuit 32.

In FIG. 7, the pulse synthesizing circuit 32 is configured by a logical gate and three switches SW1 to SW3. The logical gate includes a NAND gate 33a, a NOR gate 33b, and an EXOR gate 33c. The switch SW1 is configured by a P-channel transistor whose input terminal is connected to the first electric potential (for example, 5 V), and the switch SW2 is configured by an N-channel transistor whose input terminal is connected to the second electric potential (for example, 0 V). The switch SW3 is configured by an analog switch whose input terminal is connected to the third electric potential (for example, 2.5 V). In this case, the first electric potential>the third electric potential>the second electric potential is satisfied.

One input terminal of the NAND gate 33a receives an output signal from the inverting output terminal (Q bar) of the DFF 26. Further, the other input terminal of the NAND gate 33a receives an output signal from the output terminal (Q) of the DFF 27. The NAND gate 33a performs NAND so as to output a result. The output signal is supplied to the switch SW1 and is also supplied to one input terminal of the EXOR gate 33c.

One input terminal of the NOR gate 33b receives an output signal from the inverting output terminal (Q bar) of the DFF 26. Further, the other input terminal of the NOR gate 33b receives an output signal from the output terminal (Q) of the DFF 27. The NOR gate 33b performs the NOR operation on both the signals so as to output the signal. The output signal is supplied to the switch SW2 and is also supplied to the other input terminal of the EXOR gate 33c.

One input terminal of the EXOR gate 33c receives the signal from the NAND gate 33a. Further, the other input terminal of the EXOR gate 33c receives a signal from the NOR gate 33b. The EXOR gate 33c performs exclusive OR so as to output a result. The output signal is supplied to the switch SW3.

In such a configuration, the signals as the output signals from the respective logical gates 33a, 33b, and 33c serve as control signals of the switches SW1 to SW3, and the states of the switches SW1 to SW3 change as follows.

When the signal of the inverting output terminal of the DFF 26 is "1" (the logical value) and the signal of the output terminal of the DFF 27 is "0", the output signal from the NAND gate 33a is set to "1", and the switch SW1 is turned off. Further, the output signal from the NOR gate 33b is set to "0" so that the switch SW2 is turned off. Further, the output signal from the EXOR gate 33c is set to "1" so that the switch SW3 is turned on. Therefore, the switch SW1 is turned off, the switch SW2 is turned off, and the switch SW3 is turned on, and thus the output potential is set to the third electric potential by turning on the switch SW3.

When the signal of the inverting output terminal of the DFF 26 is "1" and the signal of the output terminal of the DFF 27 is "1", the output signal from the NAND gate 33a is set to "0", and the switch SW1 is turned on. Further, the output signal from the NOR gate 33b is set to "0" so that the switch SW2 is turned off. Further, the output signal V5 from the EXOR gate 33c is set to "0" so that the switch SW3 is turned off. Therefore, the switch SW1 is turned on, the switch SW2 turned off, and the switch SW3 is turned off, and thus the output potential is set to the first electric potential by turning on the switch SW1.

When the signal of the inverting output terminal of the DFF 26 is "0" and the signal of the output terminal of the DFF 27 is "0", the output signal from the NAND gate 33a is "1", and the switch SW1 is turned off. Further, the output signal from the NOR gate 33b is set to "1" so that the switch SW2 is turned on. Further, the output signal from the EXOR gate 33c is set to "0" so that the switch SW3 is turned off. Therefore, the switch SW1 is turned off, the switch SW2 is turned on, and the switch SW3 is turned off, and thus the output potential is set to the second electric potential by turning on the switch SW2.

When the signal of the inverting output terminal of the DFF 26 is "0" and the signal of the output terminal of the DFF 27 is "1", the output signal from the NAND gate 33a is set to "1", and the switch SW1 is turned off. Further, the output signal from the NOR gate 33b is set to "0" so that the switch SW2 is turned off. Further, the output signal from the EXOR gate 33c is set to "1" so that the switch SW3 is turned on. Therefore, the switch SW1 is turned off, the switch SW2 is turned off, and the switch SW3 is turned on, and thus the output potential is set to the third electric potential by turning on the switch SW3.

Therefore, also in the circuit configuration in FIG. 7, the two pulses from the DFFs 26 and 27 are synthesized so that the ternary signal of +1, 0, and −1 is generated.

Further, in FIG. 8, the pulse synthesizing circuit 32 is configured by the logical gate and the three switches SW1 to SW. The logical gate includes the NOR gate 33a, the NAND gate 33b, and the EXOR gate 33c. The switch SW1 is configured by a three-state buffer whose input terminal is connected to the first electric potential, and the switch SW2 is configured by a three-state buffer whose input terminal is connected to the second electric potential. The switch SW3 is configured by an analog switch whose input terminal is connected to the third electric potential. Here, the first electric potential>the third electric potential>the second electric potential is satisfied.

One input terminal of the NOR gate 33a receives the output signal from the output terminal (Q) of the DFF 26. Further, the other input terminal of the NOR gate 33a receives the output signal from the inverting output terminal (Q bar) of the DFF 27. The output signal from the NOR gate 33a is supplied to the switch SW1 and is also supplied to one input terminal of the EXOR gate 33c.

One input terminal of the NAND gate 33b receives the output signal from the output terminal (Q) of the DFF 26. Further, the other input terminal of the NAND gate 33b receives the output signal from the inverting output terminal (Q bar) of the DFF 27. The output signal from the NAND gate 33b is supplied to the switch SW2 and is also supplied to the other input terminal of the EXOR gate 33c.

One input terminal of the EXOR gate 33c receives the signal from the NOR gate 33a. Further, the other input terminal of the EXOR gate 33c receives the signal from the NAND gate 33b. The output signal from the EXOR gate 33c is supplied to the switch SW3.

The signals that are the output signals from the logical gates 33a, 33b, and 33c serve as control signals of the switches SW1 to SW3, respectively, and similarly, signals of the first electric potential, the third electric potential, and the second electric potential are output. A person skilled in the art can consider any combination of the logical gates and the switches SW1 to SW3 other than those in FIGS. 7 and 8 within a range of the technical idea of the present invention.

Further, in the configuration of FIG. 1, a bias generating circuit may be provided between the integrator 20 and the chopper circuit 22, and between the phase inverting circuit 21 and the chopper circuit 23 so as to adjust a signal level. Further, when the bias generating circuit is provided to adjust a signal level, presence/absence of a signal pulse may be detected so that a bias level may be adjusted.

Further, this embodiment has described the case where the pulse synthesizing circuit 32 synthesizes a one-bit digital signal from the DFF 26 and a one-bit digital signal from the DFF 27, that is, synthesizes pulse density modulation (PDM) signals. However, the present invention is not necessarily limited thereto and can be applied similarly to a pulse width modulation (PWM) signal. That is, the pulse synthesizing circuit 32 of the present invention inputs two signals, controls the three switches SW1 to SW3 into the on/off state according to the states of these two signals, and sets an output potential to any of the first electric potential, the second potential, and the third potential between the first electric potential and the second potential. Particularly, the present invention has significance in that the switch SW3 sets the third potential when both the switches SW1 and SW2 connected to each other in series are turned on. The type of an input signal is not particularly limited.

That is, the pulse synthesizing circuit for synthesizing a first one-bit digital signal and a second one-bit digital signal so as to generate a ternary signal, may include a logic circuit for outputting a first electric potential in a first case of a combination of a logical value of the first one-bit digital signal and a logical value of the second one-bit digital signal, outputting a second electric potential that is smaller than the first electric potential in a second case where a combination of a logical value of the first one-bit digital signal and a logical value of the second one-bit digital signal is different from the combination in the first case, and outputting a third electric potential between the first electric potential and the second electric potential in a third case where a combination of a logical value of the first one-bit digital signal and a logical value of the second one-bit digital signal is different from the combinations in the first case and the second case.

What is claimed is:

1. A pulse synthesizing circuit for synthesizing a first one-bit digital signal and a second one-bit digital signal to generate a ternary signal, the circuit comprising:

a logic circuit for outputting a first electric potential in a first case of a combination of a logical value of the first one-bit digital signal and a logical value of the second one-bit digital signal, outputting a second electric potential smaller than the first electric potential in a second case where a combination of a logical value of the first one-bit digital signal and a logical value of the second one-bit digital signal is different from the combination in the first case, and outputting a third electric potential between the first electric potential and the second electric potential in a third case where a combination of a logical value of the first one-bit digital signal and a logical value of the second one-bit digital signal is different from the combinations in the first case and the second case, wherein the logic circuit outputs the first electric potential when the logical value of the first one-bit digital signal is 1 and the logical value of the second one-bit digital signal is 0, outputs the second electric potential smaller than the first electric potential when the logical value of the first one-bit digital signal is 0 and the logical value of the second one-bit digital signal is 1, and outputs the third electric potential between the first electric potential and the second electric potential when the logical value of the first one-bit digital signal is 1 and the logical value of the second one-bit digital signal 1 or when the logical value of the first one-bit digital signal is 0 and the logical value of the second one-bit digital signal is 0.

2. The pulse synthesizing circuit according to claim 1, wherein the logic circuit includes a logical gate group and a switch group, the switch group includes
a first switch connected to the first electric potential,
a second switch connected to the second electric potential, and
a third switch connected to the third electric potential, and the logical gate group outputs a control signal for turning on the first switch when the logical value of the first one-bit digital signal is 1 and the logical value of the second one-bit digital signal is 0, outputs a control signal for turning on the second switch when the logical value of the first one-bit digital signal is 0 and the logical value of the second one-bit digital signal is 1, and outputs a control signal for turning on the third switch when the logical value of the first one-bit digital signal is 1 and the logical value of the second one-bit digital signal is 1 or when the logical value of the first one-bit digital signal is 0 and the logical value of the second one-bit digital signal is 0.

3. The pulse synthesizing circuit according to claim 2, wherein the first switch is a first three-state buffer whose input terminal is connected to the first electric potential,
the second switch is a second three-state buffer whose input terminal is connected to the second electric potential,
the third switch is an analog switch whose input terminal is connected to the third electric potential,
output terminals of the first, second, and third switches are connected, and
the logical gate group includes
a first NOR gate for receiving an inverted signal of the first one-bit digital signal and the second one-bit digital signal, and performing a logical operation so as to output a signal to a control terminal of the first switch, a second NOR gate for receiving the first one-bit digital signal and an inverted signal of the second one-bit digital signal, and performing a logical operation so as to output a signal to a control terminal of the second switch, and
a third NOR gate for receiving a control signal from the first NOR gate and a control signal from the second NOR gate, and performing a logical operation so as to output the control signals to the third switch.

4. A pulse synthesizing circuit for synthesizing a first one-bit digital signal and a second one-bit digital signal to generate a ternary signal, the circuit comprising:

a logic circuit for outputting a first electric potential in a first case of a combination of a logical value of the first one-bit digital signal and a logical value of the second one-bit digital signal, outputting a second electric potential smaller than the first electric potential in a second case where a combination of a logical value of the first one-bit digital signal and a logical value of the second one-bit digital signal is different from the combination in the first case, and outputting a third electric potential between the first electric potential and the second electric potential in a third case where a combination of a logical value of the first one-bit digital signal and a logical value of the second one-bit digital signal is different from the combinations in the first case and the second case, wherein the logic circuit outputs the first electric potential when the logical value of the first one-bit digital signal is 1 and the logical value of the second one-bit digital signal is 1, outputs the second electric potential smaller than the first electric potential when the logical value of the first one-bit digital signal is 0 and the logical value of the second one-bit digital signal is 0, and outputs the third electric potential between the first electric potential and the second electric potential when the logical value of the first one-bit digital signal is 1 and the logical value of the second one-bit digital signal is 0 or when the logical value of the first one-bit digital signal is 0 and the logical value of the second one-bit digital signal is 1, the logic circuit includes a logical gate group and a switch group, the switch group includes
a first switch connected to the first electric potential,
a second switch connected to the second electric potential, and
a third switch connected to the third electric potential, and the logical gate group outputs a control signal for turning on the first switch when the logical value of the first one-bit digital signal is 1 and the logical value of the second one-bit digital signal is 1, outputs a control signal for turning on the second switch when the logical value of the first one-bit digital signal is 0 and the logical value of the second one-bit digital signal is 0, and outputs a control signal for turning on the third switch when the logical value of the first one-bit digital signal is 1 and the logical value of the second one-bit digital signal is 0 or when the logical value of the first one-bit digital signal is 0 and the logical value of the second one-bit digital signal is 1.

5. The pulse synthesizing circuit according to claim 4, wherein the first switch is a P channel MOSFET,
the second switch is a N channel MOSFETs,
the third switch is an analog switch, and the logical gate group includes
- a NAND gate for receiving the first one-bit digital signal and the second one-bit digital signal, and performing a logical operation so as to output a control signal to a gate of the first switch,
- a NOR gate for receiving the first one-bit digital signal and the second one-bit digital signal, and performing a logical operation so as to output a control signal to a gate of the second switch, and
- an EXOR gate for receiving the control signal from the NAND gate and the control signal from the NOR gate, and performing a logical operation so as to output a control signal to the third switch.

6. A pulse synthesizing circuit for synthesizing a first one-bit digital signal and a second one-bit digital signal to generate a ternary signal, the circuit comprising:
- a logic circuit for outputting a first electric potential in a first case of a combination of a logical value of the first one-bit digital signal and a logical value of the second one-bit digital signal, outputting a second electric potential smaller than the first electric potential in a second case where a combination of a logical value of the first one-bit digital signal and a logical value of the second one-bit digital signal is different from the combination in the first case, and outputting a third electric potential between the first electric potential and the second electric potential in a third case where a combination of a logical value of the first one-bit digital signal and a logical value of the second one-bit digital signal is different from the combinations in the first case and the second case, wherein the first one-bit digital signal and the second one-bit digital signal are signals subjected to delta sigma modulation.

\* \* \* \* \*